US012707987B1

(12) United States Patent
Popelar et al.

(10) Patent No.: US 12,707,987 B1
(45) Date of Patent: Aug. 11, 2026

(54) BALL GRID ARRAY ASSEMBLY USING A SOLDER PASTE MIX AND METHOD OF USING A SOLDER PASTE DIP

(71) Applicant: Cobham Advanced Electronic Solutions Inc., Arlington, VA (US)

(72) Inventors: Scott Popelar, Colorado Springs, CO (US); Julie Hook, Colorado Springs, CO (US); Sean Brinlee, Woodland Park, CO (US)

(73) Assignee: Frontgrade Technologies Inc., Colorado Springs, CO (US)

( * ) Notice: Subject to any disclaimer, the term of this patent is extended or adjusted under 35 U.S.C. 154(b) by 717 days.

(21) Appl. No.: 17/824,726

(22) Filed: May 25, 2022

(51) Int. Cl.

| | |
|---|---|
| ***H10W 70/05*** | (2026.01) |
| ***H10W 70/66*** | (2026.01) |
| ***H10W 72/00*** | (2026.01) |
| ***H10W 72/20*** | (2026.01) |

(Continued)

(52) U.S. Cl.
CPC ....... *H10W 70/098* (2026.01); *H10W 70/093* (2026.01); *H10W 70/66* (2026.01); *H10W 90/701* (2026.01); *H10W 72/0112* (2026.01); *H10W 72/01215* (2026.01); *H10W 72/01257* (2026.01); *H10W 72/255* (2026.01); *H10W 74/15* (2026.01); *H10W 90/724* (2026.01);
(Continued)

(58) Field of Classification Search
CPC ............. H01L 21/4853; H01L 21/4867; H01L 2224/11822; H01L 2224/11823; H01L 2224/11848; H01L 2224/11849; H01L 2224/1357; H01L 2224/13575–13584; H01L 2224/13611; H01L 2224/13616; H01L 2224/16225; H01L 2224/32225; H01L 2224/48229; H01L 2224/73204; H01L 23/49816; H01L 23/49866; H01L 24/11; H01L 24/12; H01L 24/13; H01L 24/14; H01L 24/30; H01L 24/32; H01L 24/48; H01L 24/73; H01L 24/742; H01L 24/81; H01L 24/75; H01L 2224/49816; C23C 2/32; H10W 70/098; H10W 70/093; H10W 70/66; H10W 95/00; H10W 99/00; H10W 90/701; H10W 90/724; H10W 90/734; H10W 90/754; H10W 72/0112; H10W 72/01215; H10W 72/01257; H10W 72/255; H10W 74/15; B23K 1/08; B23K 1/06
See application file for complete search history.

(56) References Cited

U.S. PATENT DOCUMENTS

2016/0035688 A1* 2/2016 Fukuhara .......... H01L 23/49816
257/737

FOREIGN PATENT DOCUMENTS

CN 101256996 A * 9/2008 ............. H01L 24/83

OTHER PUBLICATIONS

FCT Solder (Year: 2018).*

* cited by examiner

*Primary Examiner* — Julio J Maldonado
*Assistant Examiner* — Nathan Pridemore
(74) *Attorney, Agent, or Firm* — Alston & Bird LLP

(57) ABSTRACT

A method for manufacturing a ball grid array (BGA) assembly is disclosed. An example method may include coating at least a portion of each solder ball of a BGA in a solder paste mix. The method may further include mounting the BGA onto a secondary board to form the BGA assembly, wherein
(Continued)

mounting the BGA on the secondary board comprises mounting each solder ball coated with the solder paste mix to the secondary board.

20 Claims, 8 Drawing Sheets

(51) Int. Cl.
*H10W 74/15* (2026.01)
*H10W 90/00* (2026.01)
(52) U.S. Cl.
CPC ........ *H10W 90/734* (2026.01); *H10W 90/754* (2026.01)

105
910

950

905
910
100

950
100
920
910

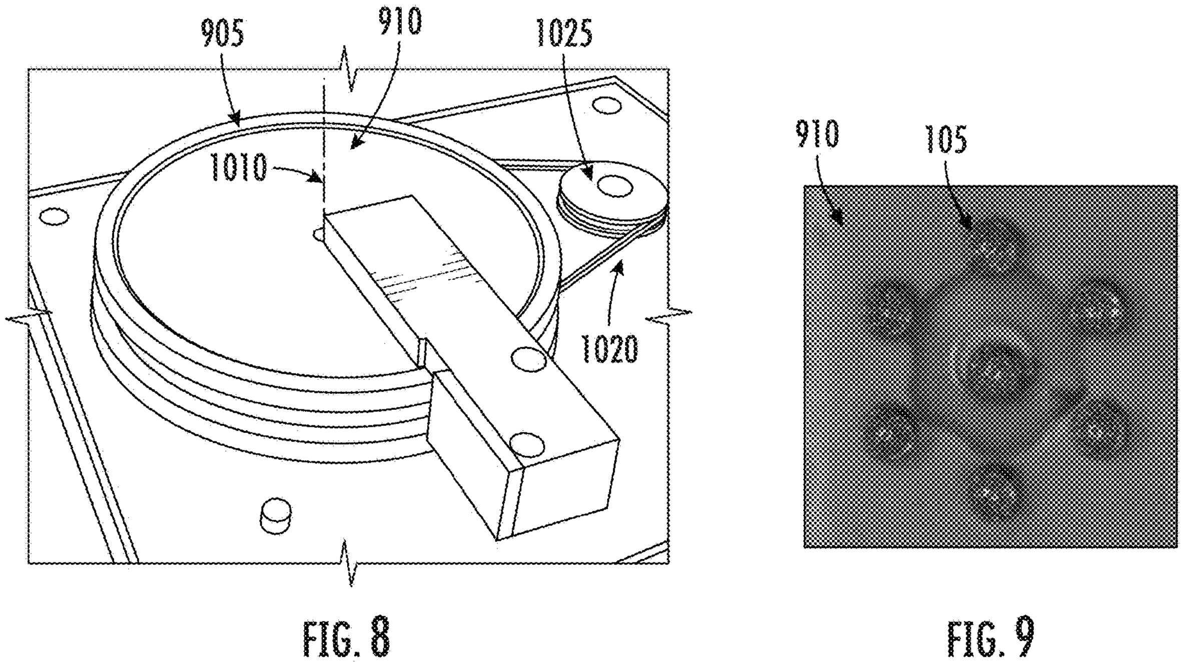
FIG. 8
FIG. 9
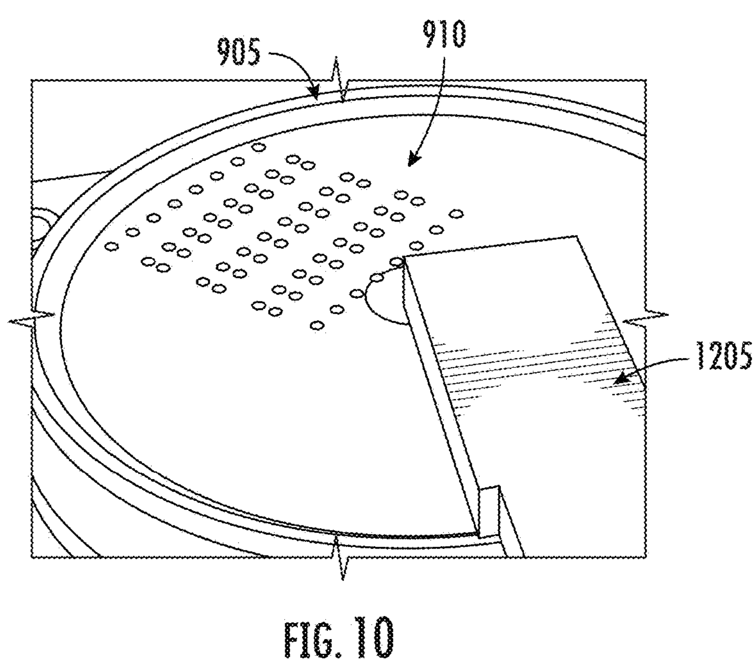
FIG. 10

BALL GRID ARRAY ASSEMBLY USING A SOLDER PASTE MIX AND METHOD OF USING A SOLDER PASTE DIP

TECHNICAL FIELD

The disclosed embodiments relate generally to a ball grid array assembly, and, more particularly, to a ball grid array assembly using a solder paste mix, and a method of using a solder paste dip.

BACKGROUND

A ball grid array (BGA) is a surface-mount package that may be used to mount and/or electrically connect components on printed circuit boards (PCBs). In particular, solder balls may be placed in a grid-like pattern on a board on an underside of the BGA package. A PCB may have a matching grid pattern of landing pads (i.e., conductive pads) which may receive the solder balls and provide electrical interconnection upon reflow assembly of the BGA to PCB. Applicant has identified a number of deficiencies and problems associated with conventional BGA implementations. Through applied effort, ingenuity, and innovation, many of these identified problems have been solved by developing solutions that are included in embodiments of the present disclosure as described in detail herein.

BRIEF SUMMARY

In order to solve these problems and others, the embodiments of the present disclosure provide example methods of manufacturing BGA assemblies in which at least a portion of each solder ball of the BGA is coated in a solder paste mix. In particular, each of the plurality of solder balls may be placed onto a landing pad of a plurality of landing pads on the board, such as a PCB. In doing so, the solder paste mix advantageously adds solder to the BGA joint, thereby improving reliability, while also allowing the BGA assembly to be inserted at any step along the BGA assembly flow process (i.e., not restricted to the beginning of the assembly flow). Furthermore, the methods described herein allow for BGA rework without the need to print solder paste onto the landing pads of the board and provides for the use of mixed alloys for a BGA assembly without mixing alloys among the solder joints.

An example method of manufacturing a ball grid array (BGA) assembly is provided. The method may include coating at least a portion of each solder ball of a BGA in a solder paste mix. The BGA may include a plurality of solder balls, and the solder paste mix may include a solder paste. The method may further include mounting the BGA onto a secondary board to form the BGA assembly. Mounting the BGA on the secondary board may further include mounting each solder ball coated with the solder paste mix to the secondary board.

In some embodiments, the solder paste mix may include a different solder paste material than a solder paste used to form the plurality of solder joints between the solder balls and a die.

In some embodiments, coating at least a portion of each solder ball may further include dipping the solder balls of the BGA into a solder paste mix reservoir configured to support the solder paste mix.

In some further embodiments, lowering the BGA may further include lowering the BGA to an application depth within the solder paste mix reservoir.

In some still further embodiments, the BGA may be lowered substantially parallel with respect to a bottom surface of the solder paste mix reservoir.

In other further embodiments, lowering the BGA may further include applying an application force to the BGA while lowered within the solder paste mix reservoir.

In some other further embodiments, the method may include rotating the solder paste mix reservoir about an axis once the BGA is removed. In such an embodiment, the rotation of the solder paste mix reservoir may cause the solder paste mix to interact with a leveling arm, and the leveling arm may cause the solder paste mix to redistribute such that the solder paste mix has a substantially uniform surface profile.

In some further embodiments, the method may further include lowering the leveling arm into an interaction configuration such that the leveling arm is positioned at an interaction height above a bottom of the solder paste mix reservoir.

In some embodiments, the method may further include heating the BGA assembly to a temperature above a melting temperature of the solder paste mix such that the solder paste mix reflows on a respective solder ball to form a solder joint.

In some further embodiments, the method may include maintaining a temperature above the melting temperature of the solder paste mix for a dwell time period.

In other further embodiments, the solder joint may be directly coupled to a landing pad of the secondary board.

In some other further embodiments, the method may further include cooling the BGA assembly to solidify the solder paste mix.

In some embodiments, the secondary board may include a plurality of landing pads and mounting the BGA may further include aligning each solder ball to a landing pad of the plurality of landing pads.

In an embodiment, the solder paste mix may include a type 3, type 4, and/or type 5 solder paste.

In any embodiment, the solder paste mix may include a type 5 solder paste.

In some embodiments, the plurality of solder balls may have a pitch of approximately 300 micrometers (μm) or greater.

In some embodiments, the plurality of solder balls may have a height of approximately 150 micrometers (μm) or greater.

In some embodiments, a solder paste mix that includes a solder paste and liquid flux is provided.

In such an embodiment, the solder paste mix may include a type 3, type 4, and/or type 5 solder paste.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will be appreciated that the scope of the disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

FIG. 8 illustrates a solder paste mix reservoir in accordance with some example embodiments described herein;

FIG. 9 illustrates solder balls dipped in the solder paste mix reservoir in accordance with some example embodiments described herein; and FIG. 10 illustrates a solder paste mix reservoir after the BGA has been dipped and removed in accordance with some example embodiments described herein.

Figure 1A:
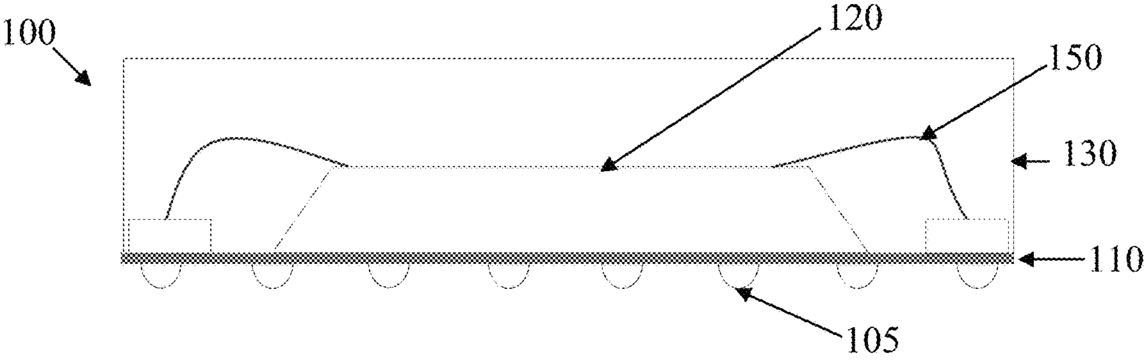
FIGS. 1A-1B illustrate example BGAs which may be used in accordance with some embodiments described herein.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Some embodiments of the present disclosure will now be described more fully hereinafter with reference to the accompanying drawings, in which some, but not all embodiments of the disclosure are shown. Indeed, this disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

As used herein, the phrases "in one embodiment," "according to one embodiment," "in some embodiments," and the like generally refer to the fact that the particular feature, structure, or characteristic following the phrase may be included in at least one embodiment of the present disclosure. Thus, the particular feature, structure, or characteristic may be included in more than one embodiment of the present disclosure such that these phrases do not necessarily refer to the same embodiment.

Numerous details are described herein to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as to avoid obscuring pertinent aspects of the embodiments described herein.

Overview

As described above, BGA assembly technology may connect solder balls to landing pads of a board, such as a printed circuit board (PCB), to form electrical interconnections. Conventionally, BGA assembly technology has utilized either solder paste or tacky flux to prepare landing pads of a board and/or solder balls for wetting during exposure to subsequent reflow (i.e., heating according to a reflow heating profile).

In particular, either a solder paste assembly method or a tacky flux assembly method may be used to form the BGA assembly. The solder paste assembly method may stencil print a solder paste onto landing pads of a board, such as the PCB. The BGA is then placed such that solder balls are aligned in the solder paste, thereby facilitating wetting between each solder ball with a landing pad upon reflow. In contrast, the tacky flux assembly method dips solder balls into tacky flux such that a discrete amount of tacky flux is transferred to the solder balls. The BGA is then placed such that each solder ball is aligned with a landing pad of the board, thereby facilitating wetting between the solder balls and landing pads upon reflow.

The above-described conventional assembly methods, however, each suffer from various shortcomings. For example, while the solder paste assembly method uses solder paste, which advantageously adds solder volume thereby increasing the size of the solder joint formed and making the joint more stable and reliable, this method requires that the solder paste be used early during the assembly flow prior to placement of any components. As such, the BGA assembly must also take place early in the assembly flow, thereby increasing the risk of yield loss during the subsequent assembly process. As another example, while the tacky flux assembly method may be performed independently of solder paste printing, thereby allowing for BGA assembly to occur in the latter stages of assembly flow, the use of tacky flux does not increase the overall solder volume and, thus, no gain in reliability is realized.

To address these issues and others, embodiments of the present disclosure provide for a method of manufacturing a BGA assembly. By way of example, at least a portion of each solder ball of a BGA is coated in a solder paste mix. The solder paste mix comprises solder paste and, in some embodiments, further comprises liquid flux. The BGA may then be mounted onto a board to form the BGA assembly. In particular, each of the plurality of solder balls may be placed onto a landing pad of a plurality of landing pads on the board, such as a PCB. In such a method, the solder paste mix advantageously adds solder to the BGA joint, thereby improving reliability, while also allowing the BGA assembly to be inserted at any step along the BGA assembly flow process (i.e., not restricted to the beginning of the assembly flow). The further method allows for BGA rework without the need to print solder paste onto the landing pads of the board. Additionally, the method allows for the use of mixed alloys for a BGA assembly without mixing alloys among the solder joints. For example, a 63 tin (Sn) 37 lead (Pb) solder may be used to assemble the joint between the solder balls and a primary board using standard surface mount procedures, while a lead-free solder may be used to assemble the interconnect between the solder balls and the secondary board (e.g., PCB) using the above-described method.

Example BGA Configuration

Figure 1B:
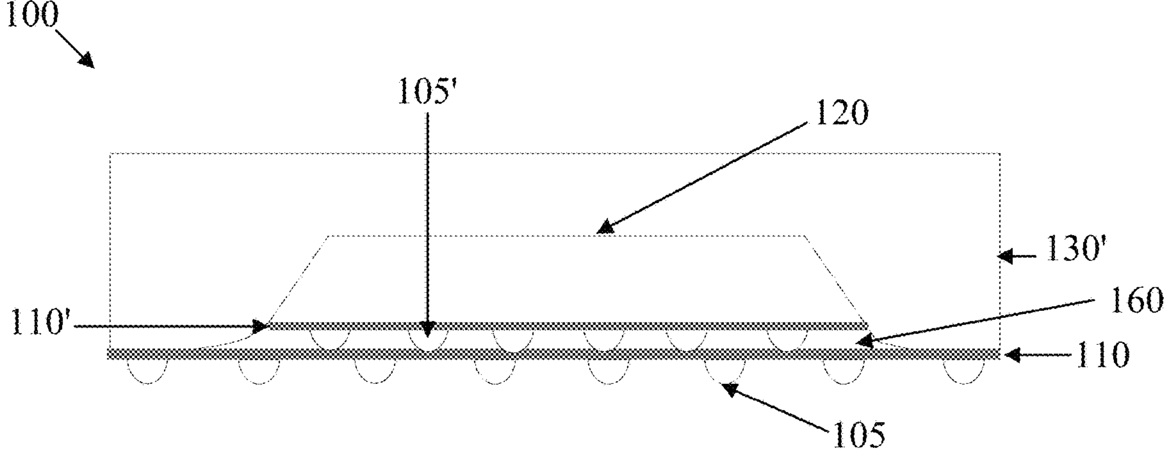

With reference to FIGS. 1A-1B, example BGA configurations 100 with which the technology disclosed herein may be implemented are depicted. FIGS. 1A-1B, depict an example BGA 100. The BGA 100 may be implemented using any type of BGA array, including but not limited to a plastic ball grid array (PBGA), a ceramic ball grid array (CBGA), a tape ball grid array (TBGA), a ceramic column grid array (CCGA), and/or the like.

As shown in FIG. 1A, the BGA 100 may be a wire bond BGA. The wire bonded BGA 100 may include a molding compound 130 (e.g., plastic, epoxy, etc.), one or more wire bonds 150, a die 120, and a plurality of solder balls 105. The die 120 may be wire bonded to a top surface of a primary board 110. The bottom side of the primary board 110 may include a plurality of solder balls 105. The plurality of solder balls 105 may be soldered to the bottom side of the primary board 110 using conventional standard surface mount procedures. In some embodiments, the plurality of solder balls 105 may include solder interconnects assembled using a tin and lead based solder, such as 63Sn/37Pb solder. The plurality of solder balls 105 may be arranged in a grid-like structure. Each of the solder balls 105 may further be coupled to a respective landing pad (not shown) on the primary board 110, such as a copper landing pad. Each landing pad may be coupled to an interconnect that electrically couples to a die. As such, electrical signals may be transmitted between the die and a PCB onto which the BGA 100 is assembled.

Alternatively, as shown in FIG. 1B, the BGA 100 may be a flip chip BGA. The flip chip BGA 100 may include a molding cap 130', a die 120, a plurality of solder balls 105, and a plurality of solder bumps 105'. In the configuration illustrated in FIG. 1B, the die 120 may be electrically connected to a top surface of a primary board 110 via the plurality of solder bumps 105'. The gap between the top of the primary board 110 and a bottom surface of a primary board 110' may be filled with a cured epoxy underfill 160. The bottom side of the primary board 110 may include a plurality of solder balls 105. The plurality of solder balls 105 may be soldered to the bottom side of the primary board 110 using conventional standard surface mount procedures. In some embodiments, the plurality of solder balls 105 may include solder interconnects assembled using a tin and lead based solder, such as 63Sn/37Pb solder. The plurality of solder balls 105 may be arranged in a grid-like structure. Each of the solder balls 105 may further be coupled to a respective landing pad (not shown) on the primary substrate 110, such as a copper landing pad. Each landing pad may be coupled to an interconnect that electrically couples to a die. As such, electrical signals may be transmitted between the die and a PCB onto which the BGA 100 is assembled.

In some embodiments, the BGA solder bumps 105' may serve as the solder balls, and the die 120 may serve as the BGA 100. Said differently, the manufacturing methods described herein may be applied to a system where the die 120, the primary board 110', and the plurality of BGA solder bumps 105' serve as the BGA 100. As such, although the system may be described for a BGA and solder balls, it will be appreciated by one of skill in the art that the BGA solder bumps from a flip chip BGA may also implement the technology disclosed herein.

Figure 2:
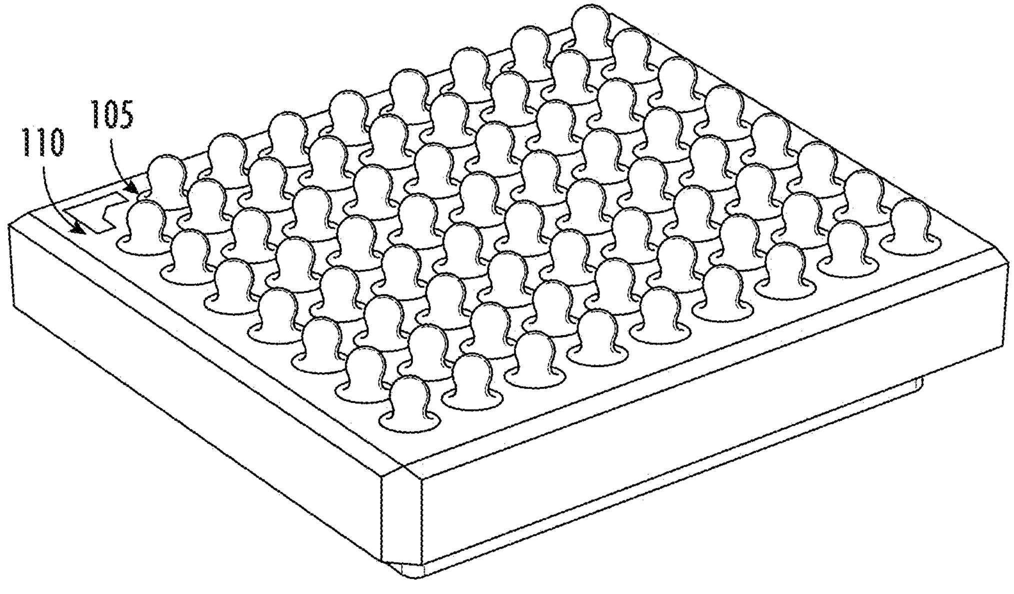
FIG. 2 depicts an example BGA configured with a plurality of solder balls in accordance with some embodiments described herein.

FIG. 2 depicts an example BGA 100 configured with a plurality of solder balls 105 on a primary board 110. As shown in FIG. 2, the plurality of solder balls 105 are arranged in a grid-like fashion. That is, the solder balls 105 are spaced substantially equidistantly from one another and may otherwise be arranged in columns and rows.

Figure 3:
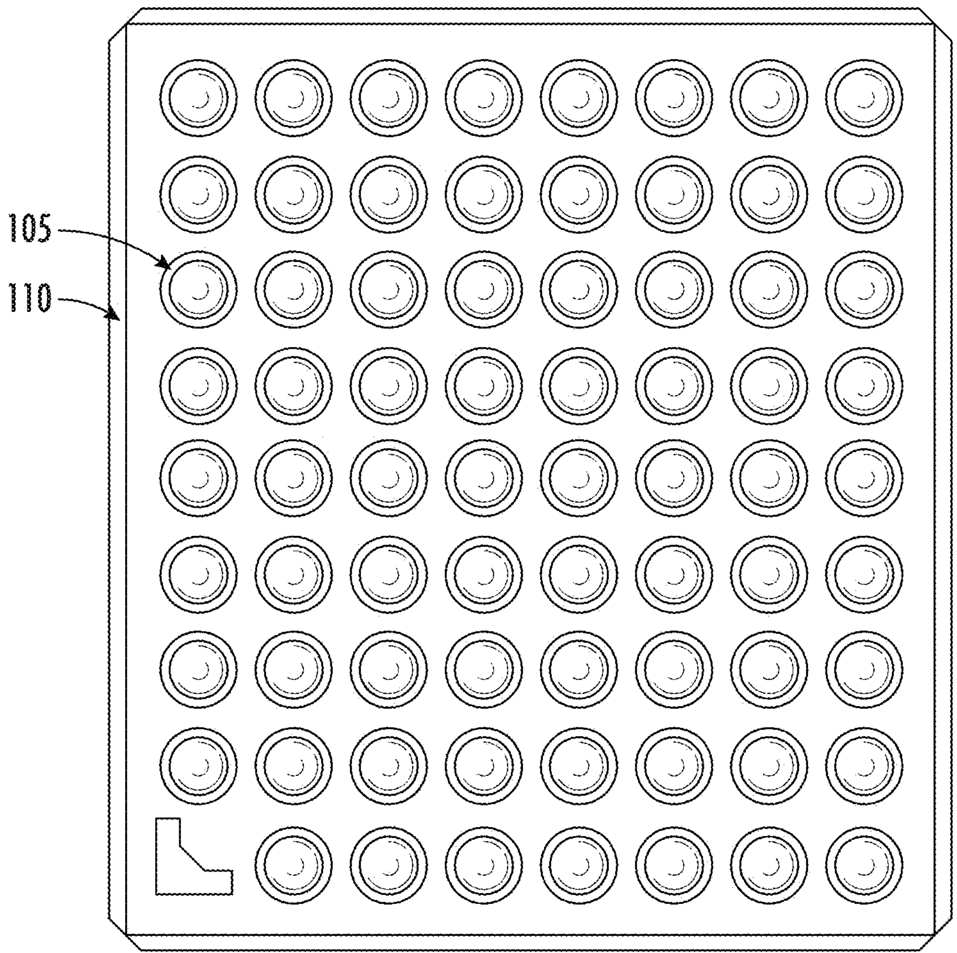
FIG. 3 depicts an example BGA configured with a plurality of solder balls on a board (i.e., package substrate) in accordance with some embodiments described herein.
Figure 4:
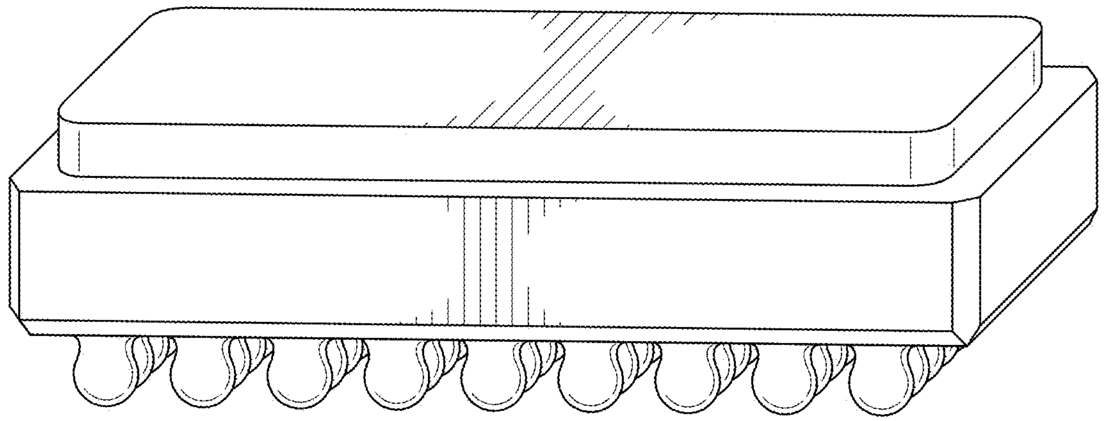
FIG. 4 depicts an example solder ball in accordance with some embodiments described herein.

FIGS. 3-4 further depict example solder balls 105. In some embodiments, the solder balls 105 are each configured with a bump height of approximately 150 micrometers (μm) or greater. In some embodiments, the solder balls 105 are each configured with a bump height of approximately 150 to 250 micrometers (μm). In some embodiments, the solder balls 105 are each configured with a bump height of approximately 175 micrometers (μm) or greater. In some embodiments, the solder balls 105 are each configured with a bump height of approximately 200 micrometers (μm) or greater. In some embodiments, the solder balls 105 are each configured with a bump height of approximately 225 micrometers (μm) or greater. In some embodiments, the solder balls 105 are each configured with a bump height of approximately 250 micrometers (μm) or greater. In some embodiments, the solder balls 105 are each configured with a bump height of approximately 300 micrometers (μm) or less. Each solder ball 105 may also be configured with a pitch of approximately 300 micrometers (μm) or greater. In some embodiments, the solder balls 105 are each configured with a pitch of approximately 300 to 500 micrometers (μm). In some embodiments, the solder balls 105 are each configured with a pitch of approximately 350 micrometers (μm) or greater. In some embodiments, the solder balls 105 are each configured with a pitch of approximately 400 micrometers (μm) or greater. In some embodiments, the solder balls 105 are each configured with a pitch of approximately 450 micrometers (μm) or greater. In some embodiments, the solder balls 105 are each configured with a pitch of approximately 500 micrometers (μm) or less.

Example Method of Manufacturing

Figure 5:
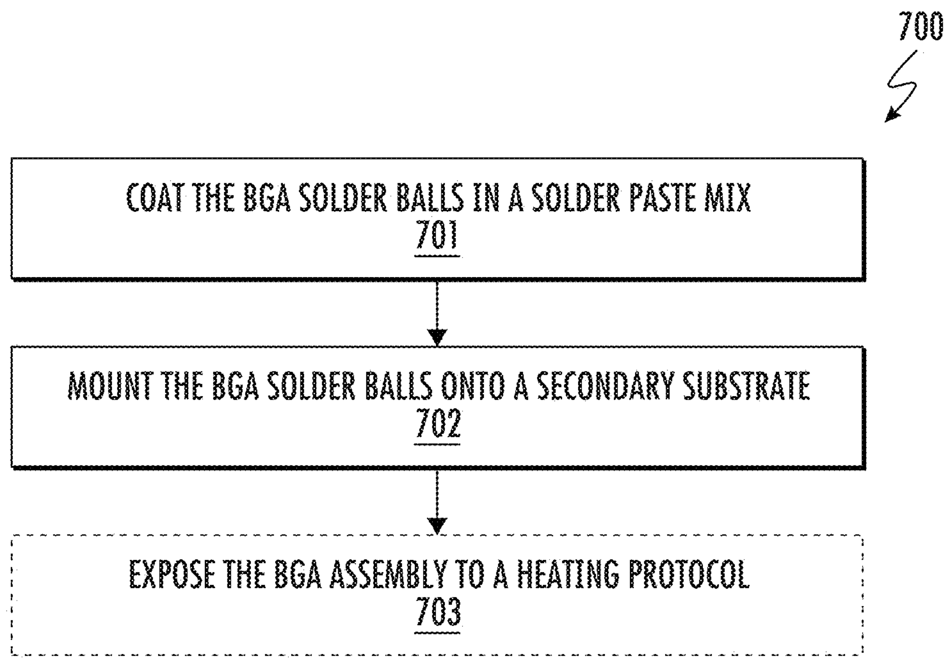
FIG. 5 illustrates an example method of manufacturing of a BGA assembly of the present disclosure in accordance with some example embodiments described herein.

FIG. 5 is an operational flow diagram of an example method 700 for manufacturing a BGA assembly. As shown in FIG. 5, at step/operation 701, the solder balls are coated in a solder paste mix. The solder paste mix may comprise a solder paste. In some embodiments, the solder paste mix may comprise a type 3 (T3), type 4 (T4), and/or type 5 (T5) solder paste. In some embodiments, the solder paste mix may further comprise a flux, such as a mix with liquid flux. For example, a solder paste mix may comprise 5 percent liquid flux or more.

Figure 6:
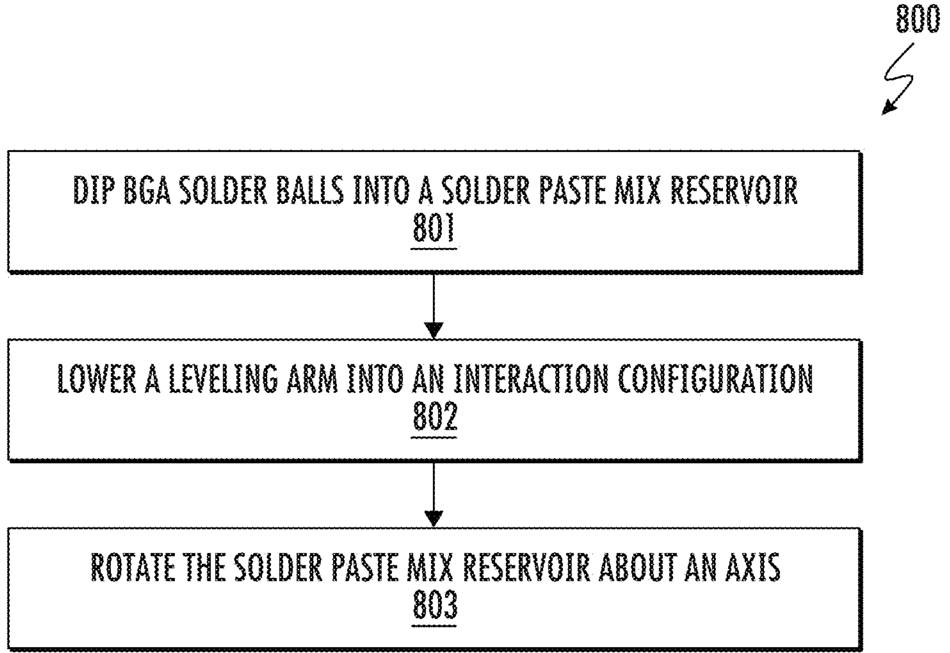
FIG. 6 illustrates an example method of manufacturing of a BGA assembly using a solder paste mix reservoir of the present disclosure in accordance with some example embodiments described herein.

In some embodiments, step/operation 701 may be performed in accordance with the process that is depicted in FIG. 6, which is an example method for coating solder balls using a solder paste mix reservoir. At step/operation, 801, the solder balls may be dipped into a solder paste mix reservoir. A solder paste mix reservoir may be configured to support the solder paste mix. A BGA may be lowered into a solder paste mix reservoir such that the solder balls are exposed to the solder paste mix in the solder paste mix reservoir. Any suitable mechanism may be used to lower the BGA into the solder paste mix reservoir. For example, a robotic mechanism may be configured to grip, attach, or otherwise hold the BGA and extend the BGA into the solder paste mix reservoir. In some embodiments, the BGA may be placed on a tray with a plurality of openings configured to expose the plurality of solder balls to the solder paste mix.

In some embodiments, the solder paste mix reservoir may be substantially cylindrical container. The substantially cylindrical container may include a substantially flat bottom surface and a side surface configured to extend perpendicularly from the bottom surface and enclose a cylindrical inner area. The solder paste mix may be stored within a portion of the cylindrical inner area. The BGA may be lowered such that it is approximately parallel to the bottom surface of the solder paste mix reservoir. As such, each solder ball may be exposed to a substantially equivalent amount of solder paste mix.

In operation, the BGA may be lowered to an application depth within the solder paste mix reservoir. The application depth to which the BGA is lowered may be measured from the bottom surface of the solder paste mix reservoir to the bottom surface of the BGA (i.e., the bottom of the solder balls). The application depth may control the portion of the solder balls which are covered in solder paste mix. For example, a shorter application depth (i.e., less space between the solder balls and the solder paste mix) may be selected to cover a larger portion of the solder balls with solder paste mix. In some embodiments, the application depth may be configured based at least in part on the type of solder paste included in the solder paste mix. For example, a solder paste mix which includes solder paste with larger particles (e.g., type 3 solder paste) may require a smaller application depth, resulting in a larger coverage area of the solder balls with the solder paste mix.

Additionally or alternatively, the BGA may be lowered into the solder paste mix reservoir, and an application force may be applied to the BGA. For example, the BGA may be lowered into the solder paste mix reservoir at a controlled acceleration. As such, the solder paste mix may coat the solder balls substantially uniformly (e.g., within applicable tolerances).

In some embodiments, once the BGA is lowered within the solder paste mix reservoir, the BGA may be rotated, swirled, vibrated, and/or the like or other perturbations to support increase solder paste mix coverage on the solder balls. Once the solder balls have been sufficiently coated in the solder paste mix, the BGA may be lifted out from the solder paste mix reservoir. The BGA may be lifted out such that it remains approximately parallel to the bottom surface of the solder paste mix reservoir. As such, this should reduce solder paste mix jostling, shaking, or other movement on the solder balls, thereby reducing the loss of solder paste mix coating the solder balls.

As will be appreciated by one of skill in the art, an alternative method may include lifting the solder paste mix reservoir to the BGA. In such a method, the solder balls may remain substantially uniformly coated in the solder paste mix.

Thereafter in step/operation 802, a leveling arm may be moved (e.g., lowered, swung, etc.) into an interaction configuration. The interaction configuration may position the level arm at an interaction height above the bottom of the solder paste mix reservoir. The interaction height may be defined as the distance between the bottom of the solder paste mix reservoir and the bottom surface of the leveling arm. This interaction height may coincide with a desired height the solder paste mix. The leveling arm may be moved into an interaction configuration once the BGA is removed from the solder paste mix reservoir.

Thereafter in step/operation 803, the solder paste mix reservoir may be rotated about an axis. The axis of rotation may be an axis perpendicular to the center of the solder paste mix reservoir. The rotation of the solder paste mix reservoir may cause the solder paste mix to interact with the leveling arm, positioned in the interaction configuration, and the leveling arm may cause the solder paste mix to redistribute such that the solder paste mix has a substantially uniform surface profile (e.g., within applicable tolerances). The solder paste mix reservoir may be rotated about the axis using any suitable mechanism. For example, a drive belt may be positioned around an exterior of the solder paste mix reservoir (e.g., about exterior side surface) and may be connected to one or more pulleys, motors (e.g., a stepper motor, servo motor, etc.), and/or the like. As such, the solder paste mix reservoir may be rotated above an axis and the solder paste mix may interact with the leveling arm. The solder paste mix reservoir may be configured to rotate any number of times and/or for any duration of time.

Additional mechanisms for the substantially uniform distribution of the solder paste mix may be contemplated. For example, the distribution of the solder paste mix may also be effectuated, at least in part, by mechanical perturbations (e.g., shaking, wobbling, vibrations, pulsations, etc.) from a motor, the speed of rotation of the solder paste mix reservoir (i.e., due to centrifugal force), or any other suitable method for the distribution of the solder paste mix.

FIG. 8 depicts an operational example of a solder paste mix reservoir 905 which support a solder paste mix 910. As shown in FIG. 8, the surface profile of the solder paste mix is substantially uniform (e.g., within applicable tolerances). As such, each of the solder balls which are dipped into the solder paste mix reservoir 905 may be substantially uniformly coated in solder paste mix.

FIG. 9 depicts an operation example of solder balls 105 dipped in the solder paste mix 910 of the solder paste reservoir. As shown in FIG. 9, a portion of the solder balls 105 are lowered or dipped within the solder paste mix 910. As such, the portions of the solder balls 105 which are in contact with the solder paste mix 910 may be coated in the solder paste mix while the portions of the solder balls 105 which are not in contact with the solder paste mix 910 may not be coated in the solder paste mix.

FIG. 10 depicts an operational example of a solder paste mix reservoir 905 after a BGA has been dipped. As shown in FIG. 10, the surface profile of the solder paste mix 910 is no longer substantially uniform, due to the coating of the solder balls with the solder paste mix 910. As such, a leveling arm 1205 may be used to interact with the solder paste mix 910 and redistribute the solder paste mix 910 within the solder paste mix reservoir 905 until the surface profile is substantially uniform once again (e.g., similar to the surface profile depicted in FIG. 8). As shown in FIG. 8, the solder paste mix reservoir 905 may be rotated about an axis 1010 using a drive belt 1020 connected to a pulley 1025, which is further connected to a motor (not shown).

Returning now to FIG. 5, at step/operation 702, the solder balls may be mounted onto a secondary board. In some embodiments, the secondary board is a PCB. In some embodiments, such as when the solder balls are the BGA solder bumps as used in a flip chip BGA, the secondary board is the top side of the primary board upon which the solder balls are attached to, or will be attached to, the bottom. The mounting of the BGA on the secondary board may include mounting each solder ball coated with the solder paste mix to the secondary board. Once the BGA is mounted on the secondary board, the BGA assembly may be formed.

The secondary board may be configured with a plurality of landing pads, which may serve as electrical connections. The plurality of landing pads may be configured in a grid-like structure. The plurality of landing pads may be configured in a grid-like structure that is substantially similar to the grid-like structure of the BGA. In some embodiments, mounting the BGA further comprises aligning a particular solder ball to a corresponding landing pad of the secondary structure.

Thereafter at step/operation 703, the BGA assembly may be exposure to a heating protocol. In particular, the BGA assembly may be placed within an oven (e.g., a reflow oven) and the oven may be configured to execute a particular heating protocol. The heating protocol may define one or more ramp acceleration rates, ramp deceleration rates, dwell temperatures, dwells time periods, and/or the like. The heating protocol used for the BGA may depend on the BGA type (e.g., wire bond BGA or flip chip BGA) and/or the solder paste included in the solder paste mix. The heating protocol may define a ramp acceleration rate (3 degrees Celsius per minute) and dwell temperature (e.g., 220 degrees Celsius) that is above the melting temperature of the solder paste mix, which may cause the oven to ramp to the dwell temperature at the defined ramp acceleration rate. The heating protocol may maintain the dwell temperature for a dwell time period (e.g., 2 minutes) to allow the solder paste mix to reflow and thereby form a solder joint between a respective solder ball and the secondary board and/or landing pad. The heating protocol may further define a ramp deceleration rate (e.g., 3 degrees Celsius per minute), such that the newly formed solder joint is not thermally shocked.

Although the heating protocol is described with respect to a reflow oven, other heating mechanisms may be used. For example, an infrared lamp and/or a desoldering hot air pencil may be used to form the solder joints between the solder balls and the secondary board.

Figures 7A, 7B, 7C, 7D:
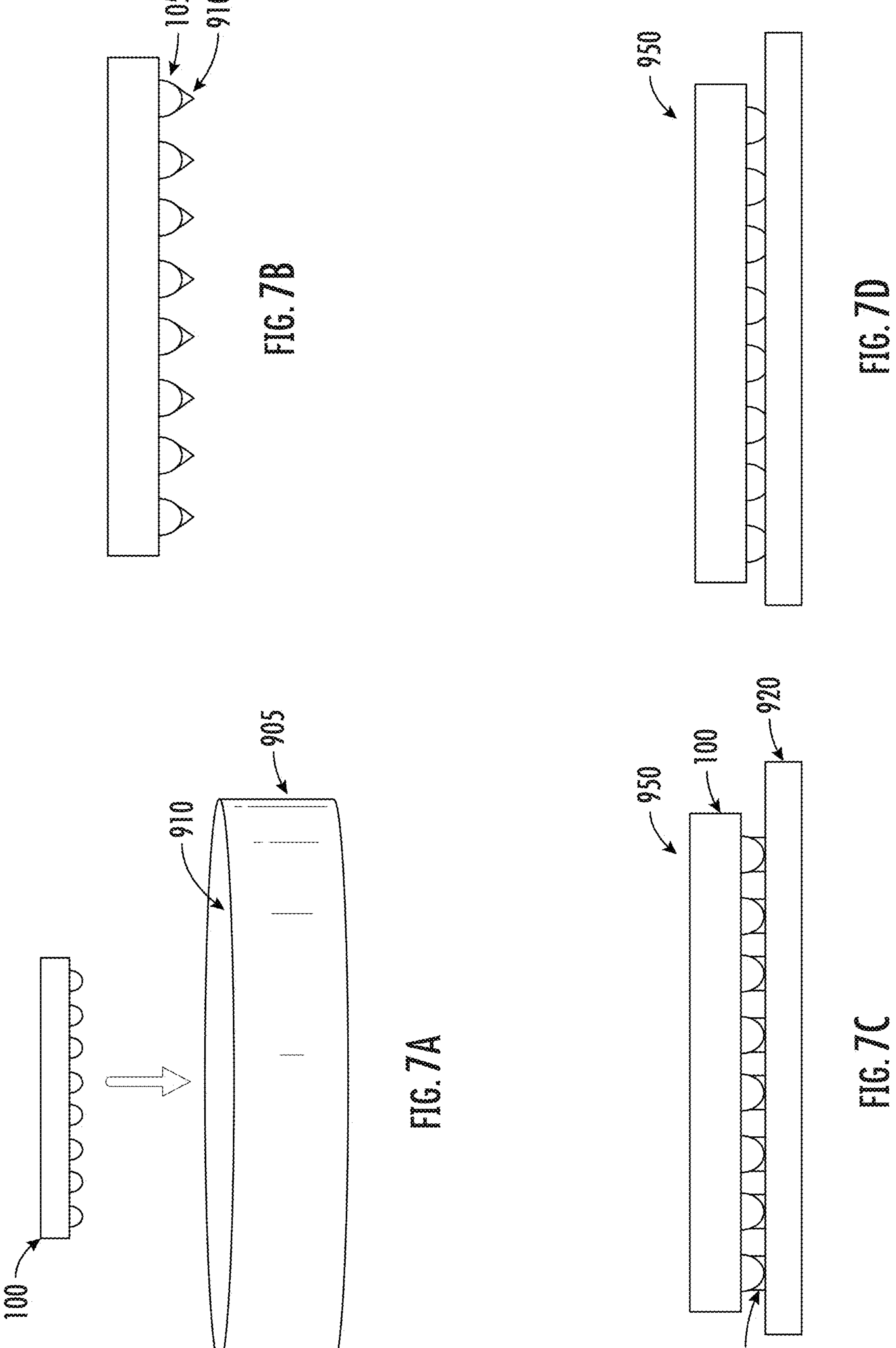
FIGS. 7A-7D illustrates a BGA at various stages of the method described in FIGS. 5 and 6 in accordance with some example embodiments described herein.

FIGS. 7A-7D further illustrate manufacturing a BGA assembly. As shown in FIG. 7A, the BGA 100 is positioned such that the solder balls are facing downward towards a solder paste mix reservoir 905, which contains the solder paste mix 910. The BGA 100 may be lowered into the solder paste mix reservoir 905 as described above, thereby coating the solder balls in the solder paste mix 910.

FIG. 7B depicts the BGA 100 after removal from the solder paste mix reservoir 905. Notably, a portion of the solder balls 105 are covered in the solder paste mix 910. In particular, the solder paste mix 910 may form "stiff peaks" upon the solder balls 105.

Thereafter, as depicted in FIG. 7C, the BGA 100 is mounted onto the secondary board 920 to form a BGA assembly 950. The solder paste mix 910 coating the solder balls 105 may thus be in contact with the secondary board 920. In particular, the solder paste mix 910 coating a particular solder ball may be in contact with a particular landing pad of the secondary board 920. The BGA assembly 950 may then be exposed to the heating protocol as described above.

As depicted in FIG. 7D, the BGA assembly 950 after exposure to the heating protocol is depicted. Here, each solder ball has formed a solder joint with the secondary board, and in some embodiments, with a landing pad of the secondary board.

FIGS. 5-6 illustrate flowcharts describing the operation of apparatuses, methods, and computer program products according to example embodiments contemplated herein. It will be understood that each flowchart block, and combinations of flowchart blocks, may be implemented by various means, such as hardware, firmware, processor, circuitry, and/or other devices associated with execution of software including one or more computer program instructions. For example, one or more of the operations described above may be implemented by an apparatus executing computer program instructions. In this regard, the computer program instructions may be stored by a memory of the computing device and executed by a processor of the computing device. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture, the execution of which implements the functions specified in the flowchart blocks. The computer program instructions may also be loaded onto a computer or other programmable apparatus to cause a series of operations to be performed on the computer or other programmable apparatus to produce a computer-implemented process such that the instructions executed on the computer or other programmable apparatus provide operations for implementing the functions specified in the flowchart blocks.

The flowchart blocks support combinations of means for performing the specified functions and combinations of operations for performing the specified functions. It will be understood that one or more blocks of the flowcharts, and combinations of blocks in the flowcharts, can be implemented by special purpose hardware-based computer systems which perform the specified functions, or combinations of special purpose hardware with computer instructions.

CONCLUSION

Moreover, many modifications and other embodiments of the present disclosure set forth herein will come to mind to one skilled in the art to which this disclosure pertains having the benefit of the teachings presented in the foregoing descriptions and the associated drawings. Therefore, it is to be understood that the present disclosure is not to be limited to the specific embodiments disclosed and that modifications and other embodiments are intended to be included within the scope of any appended claims. Moreover, although the foregoing descriptions and the associated drawings describe example embodiments in the context of certain example combinations of elements and/or functions, it should be appreciated that different combinations of elements and/or functions can be provided by alternative embodiments without departing from the scope of any appended claims. In this regard, for example, different combinations of elements and/or functions than those explicitly described above are also contemplated as can be set forth in some of any appended claims. Although specific terms are employed herein, they are used in a generic and descriptive sense only and not for purposes of limitation.

What is claimed is:

1. A method for manufacturing a ball grid array (BGA) assembly, the method comprising:

coating at least a portion of each solder ball of a BGA in a solder paste mix, wherein the BGA comprises a plurality of solder balls, and wherein the solder paste mix comprises solder paste, wherein coating at least the portion of each solder ball of the BGA in the solder paste mix comprises applying an application force to the BGA when lowered into the solder paste mix and the BGA is at least one of rotated, swirled, vibrated, and perturbed to increase solder paste mix coverage on the plurality of solder balls; and mounting the plurality of solder balls onto a secondary board to form the BGA assembly, wherein mounting the plurality of solder balls onto the secondary board comprises mounting each solder ball coated with the solder paste mix to the secondary board, wherein the secondary board comprises a plurality of landing pads, wherein the plurality of solder balls coated with the solder paste mix are mounted to the plurality of landing pads, and wherein the landing pads are absent of the solder paste mix before the solder balls coated with the solder paste mix are mounted to the plurality of landing pads.

2. The method of claim 1 wherein the solder paste mix comprises a different solder paste material than a solder paste used to form a plurality of solder joints between the solder balls and a die.

3. The method of claim 1, wherein coating at least the portion of each solder ball further comprises dipping the solder balls of the BGA into a solder paste mix reservoir configured to support the solder paste mix.

4. The method of claim 3, wherein lowering the BGA further comprises lowering the BGA to an application depth within the solder paste mix reservoir.

5. The method of claim 4, wherein the BGA is lowered substantially parallel with respect to a bottom surface of the solder paste mix reservoir.

6. The method of claim 3, wherein the application force comprises at least a controlled acceleration.

7. The method of claim 3, the method further comprising rotating the solder paste mix reservoir about an axis once the BGA is removed, wherein the rotation of the solder paste mix reservoir causes the solder paste mix to interact with a leveling arm and the leveling arm causes the solder paste mix to redistribute such that the solder paste mix has a substantially uniform surface profile.

8. The method of claim 7, the method further comprising lowering the leveling arm into an interaction configuration such that the leveling arm is positioned at an interaction height above a bottom of the solder paste mix reservoir.

9. The method of claim 1, the method further comprising heating the BGA assembly to a temperature above a melting temperature of the solder paste mix, wherein the solder paste mix reflows on a respective solder ball to form a solder joint.

10. The method of claim 9, the method further comprising maintaining the temperature above the melting temperature of the solder paste mix for a dwell time period.

11. The method of claim 9, wherein the solder joint is directly coupled to a landing pad of the secondary board.

12. The method of claim 9, the method further comprising cooling the BGA assembly to solidify the solder paste mix.

13. The method of claim 1, wherein the secondary board comprises a plurality of landing pads and mounting the BGA further comprises aligning each solder ball to a landing pad of the plurality of landing pads.

14. The method of claim 1, wherein the solder paste mix comprises a type 3 and/or type 4 solder paste.

15. The method of claim 1, wherein the solder paste mix comprises a type 5 solder paste.

16. The method of claim 1, wherein the plurality of solder balls have a pitch of approximately 300 micrometers (μm) or greater.

17. The method of claim 1, wherein the plurality of solder balls have a height of approximately 150 micrometers (μm) or greater.

18. The method of claim 1, wherein coating at least the portion of each solder ball of the BGA in the solder paste mix comprises applying the application force to the BGA when lowered into the solder paste mix and the BGA is rotated to increase solder paste mix coverage on the plurality of solder balls.

19. The method of claim 1, wherein coating at least the portion of each solder ball of the BGA in the solder paste mix comprises applying the application force to the BGA when lowered into the solder paste mix and the BGA is swirled to increase solder paste mix coverage on the plurality of solder balls.

20. The method of claim 1, wherein coating at least the portion of each solder ball of the BGA in the solder paste mix comprises applying the application force to the BGA when lowered into the solder paste mix and the BGA is vibrated to increase solder paste mix coverage on the plurality of solder balls.

* * * * *